US008107307B2

(12) United States Patent
Chou

(10) Patent No.: US 8,107,307 B2
(45) Date of Patent: Jan. 31, 2012

(54) MEMORY DEVICE WITH DATA PATHS FOR OUTPUTTING COMPRESSED DATA

(75) Inventor: Min-Chung Chou, Hsinchu (TW)

(73) Assignee: Elite Semiconductor Memory Technology Inc., Hsinchu (TW)

( * ) Notice: Subject to any disclaimer, the term of this patent is extended or adjusted under 35 U.S.C. 154(b) by 218 days.

(21) Appl. No.: 12/699,905

(22) Filed: Feb. 4, 2010

(65) Prior Publication Data
US 2011/0188322 A1    Aug. 4, 2011

(51) Int. Cl.
*G11C 7/00* (2006.01)
(52) U.S. Cl. .................................. 365/201; 365/189.05
(58) Field of Classification Search .................. 365/201, 365/189.05
See application file for complete search history.

(56) References Cited

U.S. PATENT DOCUMENTS

| 6,307,790 B1 | 10/2001 | Roohparvar et al. |
| 6,873,563 B2 * | 3/2005 | Suwa et al. .............. 365/230.03 |
| 2007/0070740 A1 | 3/2007 | Song |

* cited by examiner

*Primary Examiner* — Son Dinh
*Assistant Examiner* — Nam Nguyen
(74) *Attorney, Agent, or Firm* — Jianq Chyun IP Office

(57) ABSTRACT

A memory device is provided. The memory device includes a plurality of memory array banks, a bus, a data buffer, and four data paths. The data buffer provides data from the memory array banks to an external node. The first data path includes a first compression module for compressing the data from the memory array banks to the bus. The second data path transmits the data from the memory array banks to the bus. The third data path includes a second compression module for compressing data from the bus to the data buffer. The fourth data path transmits the data from the bus to the data buffer.

14 Claims, 4 Drawing Sheets

MEMORY DEVICE WITH DATA PATHS FOR OUTPUTTING COMPRESSED DATA

BACKGROUND OF THE INVENTION

1. Field of the Invention

The present invention relates to a memory device. More particularly, the present invention relates to outputting compressed data of a memory device.

2. Description of the Related Art

Integrated circuit memory devices typically include one or more arrays of memory cells for storing data. Such memory devices include random access memories (RAM), dynamic random access memories (DRAM), Synchronous DRAM (SDRAM), static RAM (SRAM), and non-volatile memories such as FLASH.

During production of the memory devices, the individual memory cells need to be tested. In such a test, data is written into the memory cells, and then read out from the memory cells. As the density of the memory arrays increase, the test time of whole memory array test also increases.

One technique that is usually used to decrease test time is data compression. Data read from multiple memory cells are compressed into some particular data bits by a data compression circuitry included in the memory device. This compression technique allows parallel test for many memories and/or multiple array banks of a single memory, therefore shortening the testing time.

FIG. 1 is a schematic diagram from US Patent Application Publication No. 2007/0070740, which shows a conventional memory device with a compressed output data. In the memory test, the compressor 160 compresses the 16-bit data word read from the memory cell bank 120 into a single bit with a compression algorithm. The compressor 160 could hardly satisfy all the combinations of a 16-bit data word that are as many as $2^{16}$=65,536. It is difficult for the compressor 160 to even satisfy a part of the 65,536 combinations to reach better fault coverage. Actually, to perform such read compression, each bit of the 16-bit data word must be written with the same data. Eventually, only 2 combinations are usually used, namely, the output data and its inverse.

FIG. 2 is a schematic diagram from U.S. Pat. No. 6,307,790, which shows another conventional memory device with compressed output data. The memory device in FIG. 2 has three data paths, depicted as A, B and C, respectively. Any one of the data paths A, B and C may be chosen to transmit the data read from the memory array banks 202a-202d to the output buffer 220.

When the data path A is chosen, one of the switches 212(a)-212(d) is turned on and the other switches are all turned off. The 16-bit data word read from one of the memory array banks 202a-202d is transmitted directly to the output buffer 220 without compression delay.

When the data path B is chosen, the switches 204(a)-204(d) and 207(a)-207(d) are turned on and the other switches are turned off. The 16-bit data word read from each of the memory array banks 202a-202d is compressed by one of the 4-to-1 compress logic circuits 206(a)-206(d) into a 4-bit data word. Obviously, the compression ratio is 4:1. The four 4-bit compressed data words are combined into a 16-bit data word and are transmitted to the output buffer 220. Since the original 16-bit data word is compressed into a 4-bit data word, the written data of 16-bit data word, where written data are data to be written into memory cells, has to be generated according to the 4-bit compressed data word. As a result, $2^4$=16 possible values are generated for the 16-bit data word to be written.

When the data path C is chosen, the switches 204(a)-204(d) and 218 are turned on and the other switches are turned off. The 16-bit data word read from each of the memory array banks 202a-202d is compressed by one of the 4-to-1 compress logic circuits 206(a)-206(d) into a 4-bit data word. Each of the four 4-bit data word is further compressed by the 4-to-1 compress logic circuit 210 into a single bit. The compression ratio is 16:1. The four bits output by the 4-to-1 compress logic circuit 210 are transmitted to the output buffer 220. Since the original 16-bit data word is compressed into a single bit, the written data of 16-bit data word has to be generated according to the single bit. As a result, only 2 possible values are generated for the 16-bit data word to be written.

SUMMARY OF THE INVENTION

Accordingly, the present invention is directed to a memory device with multiple data paths for outputting compressed data. The memory device provides more selectable data paths and more possible values for the generated data word to be written to the memory array banks for error detection.

According to an embodiment of the present invention, a memory device is provided. The memory device includes a plurality of memory array banks, a bus, a data buffer, and four data paths. The data buffer provides data from the memory array banks to an external node. The first data path includes a first compression module for compressing the data from the memory array banks to the bus. The second data path transmits the data from the memory array banks to the bus. The third data path includes a second compression module for compressing data from the bus to the data buffer. The fourth data path transmits the data from the bus to the data buffer.

In an embodiment of the present invention, for every two adjacent bits output by the first compression module, the first one of the two adjacent bits is a result of compressing a plurality of data bits from one of the memory array banks and the second one of the two adjacent bits is a result of compressing a plurality of data bits from another one of the memory array banks. The one of the memory array banks and the another one of the memory array banks are adjacent to each other.

In another embodiment of the present invention, the i-th bit output by the first compression module is a result of compressing the i-th data bit from each of the memory array banks and i is a non-negative integer.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
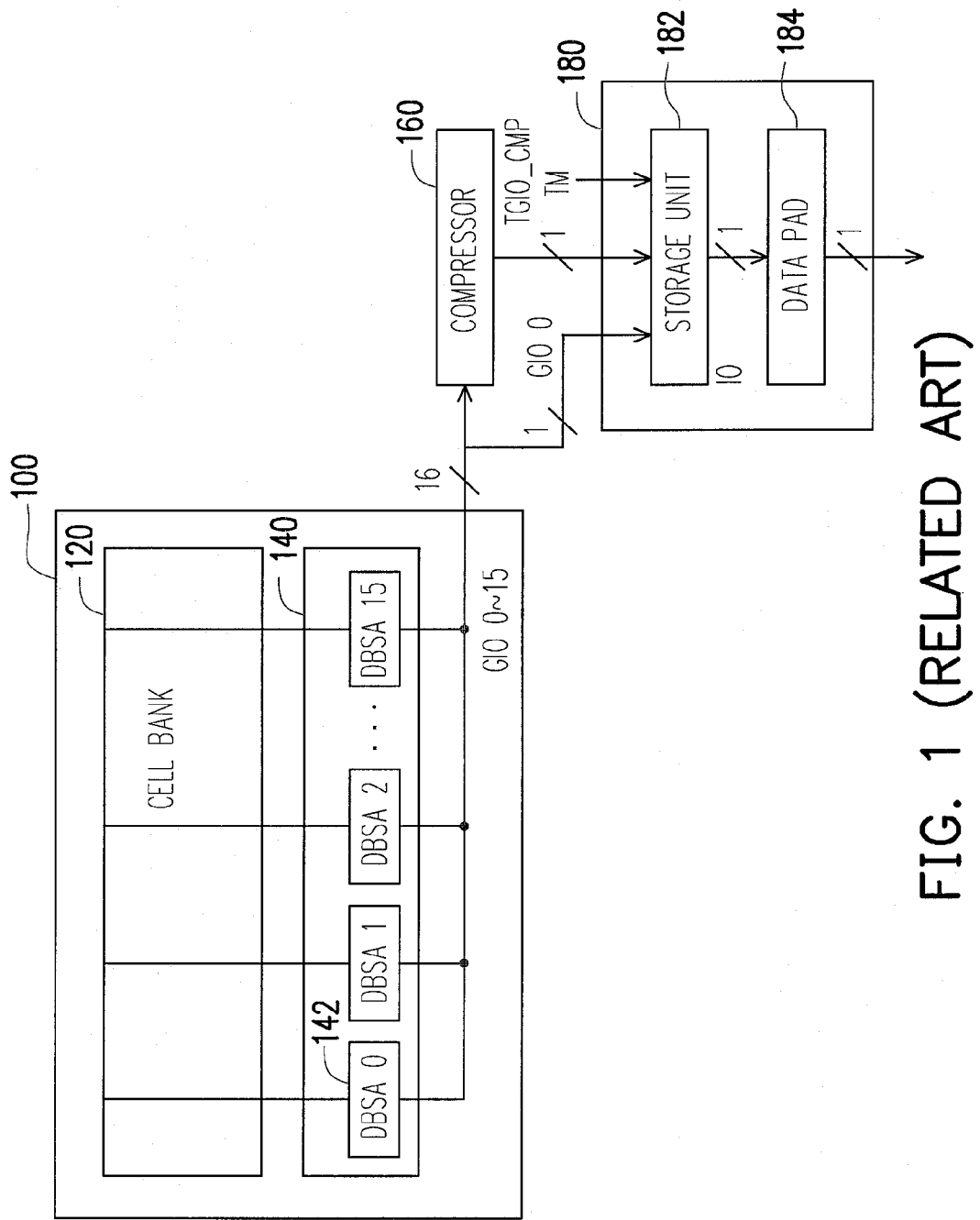
FIG. 1 is a schematic diagram showing a conventional memory device with compressed output data.

Reference will now be made in detail to the present embodiments of the invention, examples of which are illustrated in the accompanying drawings. Wherever possible, the same reference numbers are used in the drawings and the description to refer to the same or like parts.

Figure 3:
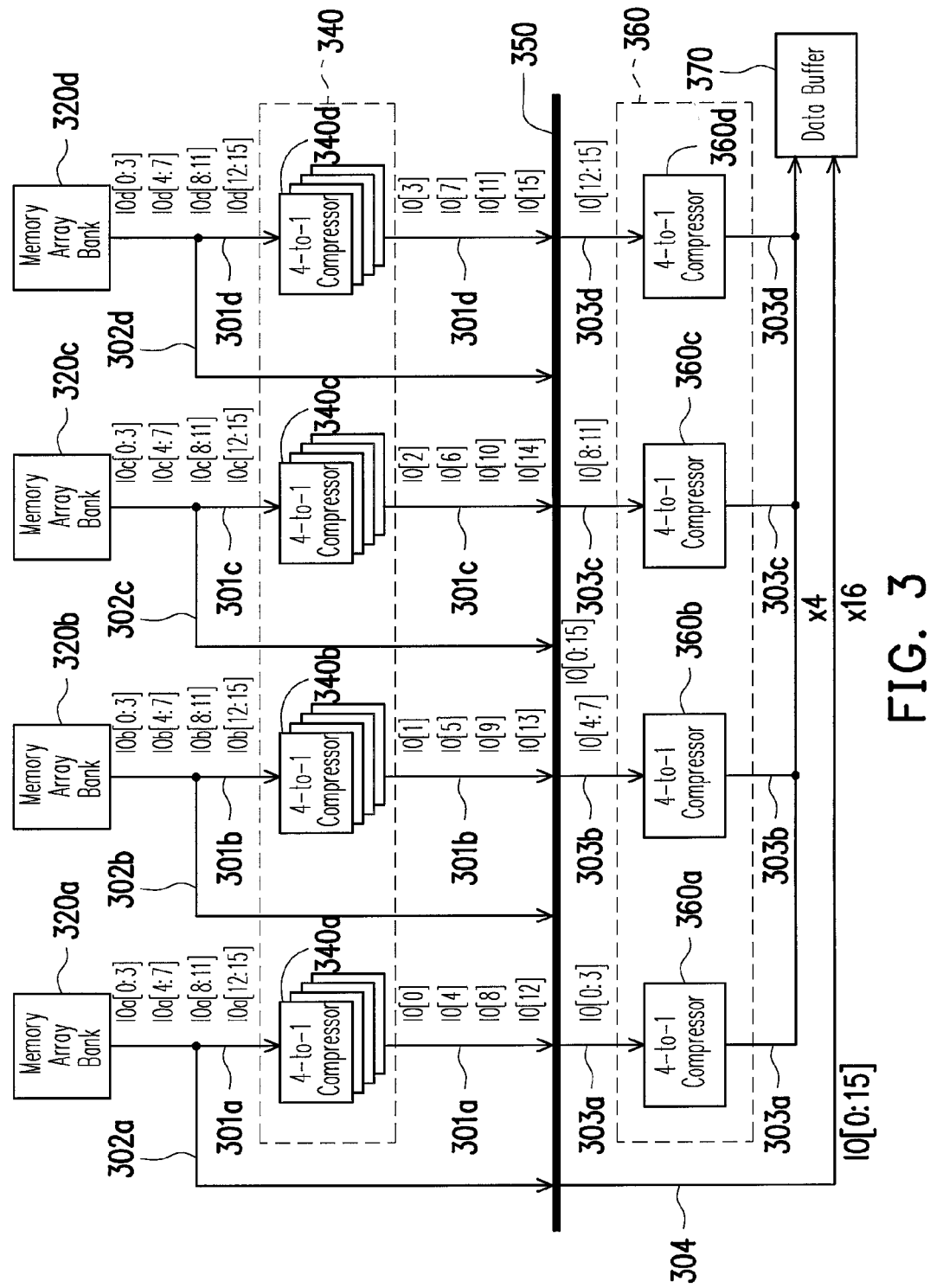
FIG. 3 is a schematic diagram showing a memory device with compressed output data according to an embodiment of the present invention.

FIG. 3 is a schematic diagram showing a memory device according to an embodiment of the present invention. The memory device includes four memory array banks 320a-320d, a bus 350, a data buffer 370, a first data path 301a-301d, a second data path 302a-302d, a third data path 303a-303d, and a fourth data path 304.

Each of the memory array banks 320a-320d may output a 16-bit data word, which are depicted as IOa[0:15], IOb[0:15], IOc[0:15] and IOd[0:15], respectively. The data buffer 370 provides the output data of the memory array banks 320a-320d to an external node (not shown). The data paths transmit the output data of the memory array banks 320a-320d through the bus 350 to the data buffer 370. The bus 350 has a width of 16 bits, which are depicted as IO[0:15].

The first data path 301a-301d transmits the output data of the memory array banks 320a-320d through the compression module 340 to the bus 350. The second data path 302a-302d transmits the output data of one of the memory array banks 320a-320d directly to the bus 350 without compression. The third data path 303a-303d transmits the data on the bus 350 through the compression module 360 to the data buffer 370. The fourth data path 304 transmits the data on the bus 350 directly to the data buffer 370 without compression.

The memory device in FIG. 3 includes a selector (not shown) for selecting one of the first and the second data paths and one of the third and the fourth data paths to transmit the output data of the memory array banks 320a-320d through the bus 350 to the data buffer 370. The four data paths may include switches or multiplexers and the selector may select two of the four data paths by controlling the switches or the multiplexers. The memory device in FIG. 2 (U.S. Pat. No. 6,307,790) provides an example of data path selection by such a selector.

When the selector selects the second data path 302a-302d and the fourth data path 304, the 16-bit output data of one of the memory array banks 320a-320d is transmitted directly to the data buffer 370 without compression. In this case, no transmission delay is caused by data compression and the problem of limited possible values of the written data does not exist.

When the selector selects the first data path 301a-301d and the fourth data path 304, the first data path 301a-301d transmits the 64-bit data word output by all of the memory array banks 320a-320d through the compression module 340. The compression module 340 compresses the 64-bit data word into the 16-bit data word IO[0:15] on the bus 350. Next, the fourth data path 304 transmits the data word IO[0:15] to the data buffer 370 directly without further compression. The compression ratio is 4:1 in this case.

The compression module 340 includes four 16-to-4 compressors 340a-340d. Each of the compressors 340a-340d consists of four 4-to-1 compressors. Each of the compressors 340a-340d is corresponding to one of the memory array banks 320a-320d. Each of the compressors 340a-340d compresses the 16-bit data word output by the corresponding memory array bank into 4 bits of the 16-bit data word IO[0:15] on the bus 350. The compressor 340a compresses the 4-bit sections IOa[0:3], IOa[4:7], IOa[8:11] and IOa[12:15] of the data word IOa[0:15] output by the memory array bank 320a into the 4 bits IO[0], IO[4], IO[8] and IO[12] of the data word IO[0:15] on the bus 350, respectively. The compressor 340b compresses the 4-bit sections IOb[0:3], IOb[4:7], IOb[8:11] and IOb[12:15] of the data word IOb[0:15] output by the memory array bank 320b into the 4 bits IO[1], IO[5], IO[9] and IO[13] of the data word IO[0:15] on the bus 350, respectively. The compressor 340c compresses the 4-bit sections IOc[0:3], IOc[4:7], IOc[8:11] and IOc[12:15] of the data word IOc[0:15] output by the memory array bank 320c into the 4 bits IO[2], IO[6], IO[10] and IO[14] of the data word IO[0:15] on the bus 350, respectively. The compressor 340d compresses the 4-bit sections IOd[0:3], IOd[4:7], IOd[8:11] and IOd[12:15] of the data word IOd[0:15] output by the memory array bank 320d into the 4 bits IO[3], IO[7], IO[11] and IO[15] of the data word IO[0:15] on the bus 350, respectively.

Regarding the data word IO[0:15] output by the compression module 340 as a whole, for every two adjacent bits of the data word IO[0:15], the first one of the two adjacent bits is the result of compressing a 4-bit section from one of the memory array banks 320a-320d and the second one of the two adjacent bits is the result of compressing a 4-bit section from another one of the memory array banks 320a-320d. The two memory array banks providing the aforementioned two adjacent bits of the data word IO[0:15] are adjacent to each other. For example, the bit IO[2] of the data word IO[0:15] is the result of compressing the 4-bit section IOc[0:3] of the memory array bank 320c and the bit IO[3] of the data word IO[0:15] is the result of compressing the 4-bit section IOd[0:3] of the memory array bank 320d. The bits IO[2] and IO[3] are adjacent in the data word IO[0:15]. The memory array banks 320c and 320d are also adjacent.

The compressors 340a-340d of the compression module 340 may use any data compression algorithm as long as the algorithm provides a 4:1 compression ratio.

The 16-bit data word output by each of the memory array banks 320a-320d is compressed by the compression module 340 into 4 bits of the data word IO[0:15] on the bus 350. Next, the data word IO[0:15] is transmitted by the fourth data path 304 directly to the data buffer 370 without further compression. The written data regarding the particular memory array bank has to be generated according to the 4 bits output by the corresponding 16-to-4 compressor. Therefore, the written data has $2^4=16$ possible values.

When the selector selects the second data path 302a-302d and the third data path 303a-303d, the 16-bit data word output by one of the memory array banks 320a-320d is transmitted by the corresponding second data path to the bus 350, and then the 16-bit data word is transmitted through the compression module 360. The compression module 360 includes four 4-to-1 compressors 360a-360d. The compressor 360a compresses the 4-bit section IO[0:3] of the data word IO[0:15] on the bus 350 into a single bit. Similarly, the compressor 360b compresses the 4-bit section IO[4:7] of the data word IO[0:15] into a single bit. The compressor 360c compresses the 4-bit section IO[8:11] of the data word IO[0:15] into a single bit. The compressor 360d compresses the 4-bit section IO[12:15] of the data word IO[0:15] into a single bit. The 4-bit data word output by the compression module 360 is received by the data buffer 370.

Similar to the compression module 340, the compressors 360a-360d of the compression module 360 may use any data compression algorithm as long as the algorithm provides a 4:1 compression ratio.

The written data regarding the particular memory array bank has to be generated according to the 4-bit data word output by the compression module 360. Therefore, the written data has $2^4=16$ possible values.

When the selector selects the first data path 301a-301d and the third data path 303a-303d, the 64-bit data word output by all of the memory array banks 320a-320d is compressed by the compression module 340 into the 16-bit data word IO[0:15] and then compressed by the compression module 360 into the 4-bit data word received by the data buffer 370. The compression ratio is 16:1. The written data regarding the particular memory array bank has to be generated according to the 4-bit data word output by the compression module 360. Therefore, the written data has 16 possible values.

Figure 2:
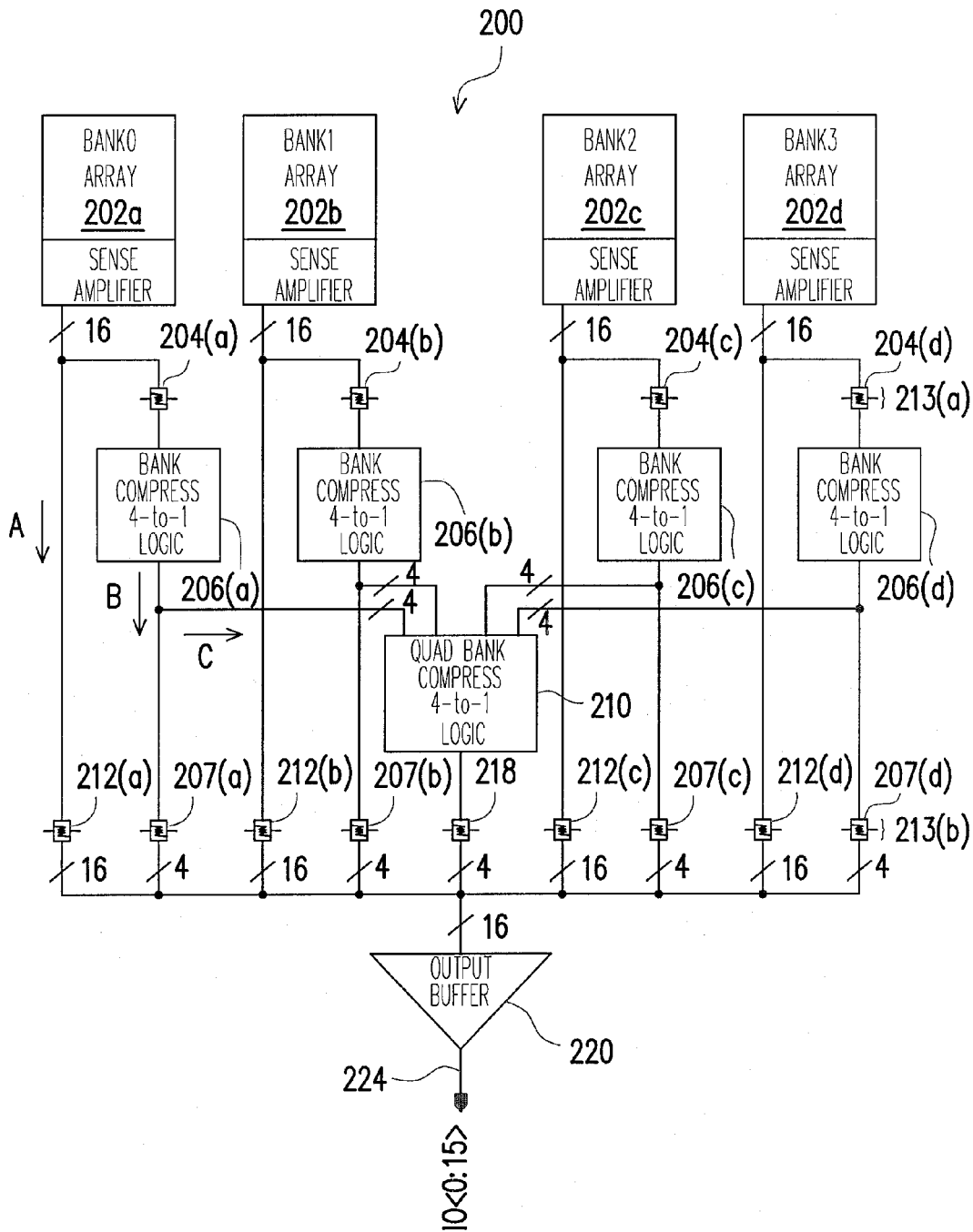
FIG. 2 is a schematic diagram showing another conventional memory device with compressed output data.

When the compression ratio is 16:1, the generated data written to any one of the memory array banks in FIG. 2 has only 2 possible values, while the generated data written to any one of the memory array banks in FIG. 3 has 16 possible values. The memory device in FIG. 3 provides more possible values under the same compression ratio, which is more beneficial for verifying errors detected in memory tests.

The memory device in FIG. 3 is only an example. In other embodiments of the present invention, there may be more or less memory array banks. There may be more or less bits in the data word output by each of the memory array banks. The compression ratio of the compressors 340a-340d and 360a-360d is not limited to 4:1. There may be more or less compressors in the compression module 360. Each of the compressors 360a-360d may receive more or less input bits.

Figure 4:
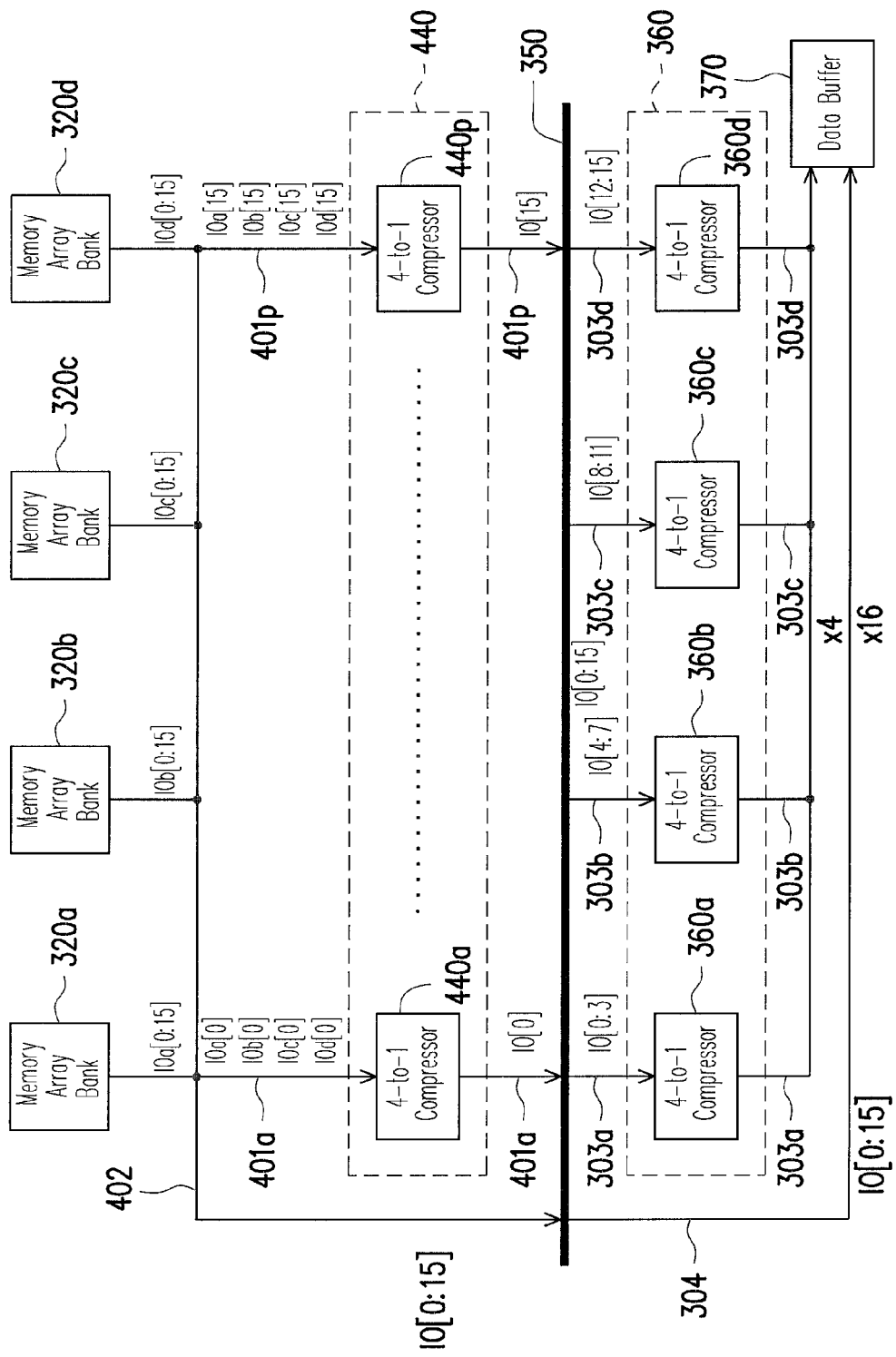
FIG. 4 is a schematic diagram showing another memory device with compressed output data according to another embodiment of the present invention.

FIG. 4 is a schematic diagram showing another memory device according to another embodiment of the present invention. Similar to the memory device in FIG. 3, the memory device in FIG. 4 has four data paths. The selector (not shown) selects two of the four data paths to control the compression of the data words output by the memory array banks 320a-320d. The differences between the memory devices in FIG. 3 and FIG. 4 are the first data path 401a-401p, the second data path 402, and the compression module 440 included in the first data path 401a-401p. The same components in FIG. 3 and FIG. 4 are marked with the same numbers.

When the selector selects the second data path 402 and the fourth data path 304, the transmission of the data word output by one of the memory array banks 320a-320d is the same as that of the memory device in FIG. 3.

When the selector selects the second data path 402 and the third data path 303a-303d, the transmission and compression of the data word output by one of the memory array banks 320a-320d are the same as those of the memory device in FIG. 3.

When the selector selects the first data path 401a-401p and the fourth data path 304, the 64-bit data word output by all of the memory array banks 320a-320d is compressed by the compression module 440 into the 16-bit data word IO[0:15] on the bus 350 and then the 16-bit data word IO[0:15] is transmitted through the fourth data path 304 to the data buffer 370 directly without further compression. The compression module 440 includes 16 4-to-1 compressors 440a-440p. As shown in FIG. 4, the i-th compressor of the compression module 440 compresses the 4-bit data word consisting of the i-th bit of the data word output by each of the memory array banks 320a-320d into the i-th bit of the data word IO[0:15] on the bus 350, wherein i is an integer from 0 to 15.

The written data regarding the particular memory array bank is generated according to the entire data word IO[0:15] because each bit of the data word output by that particular memory array bank is compressed by the compression module 440 into a corresponding bit of the data word IO[0:15]. Since the 16-bit data word IO[0:15] has $2^{16}$=65,536 possible values, the generated written data also has 65,536 possible values. When the compression ratio is 4:1, the generated written data regarding any one of the memory array banks in FIG. 2 has only 16 possible values, while the generated written data regarding any one of the memory array banks in FIG. 4 has 65,536 possible values. The memory device in FIG. 4 provides far more possible values under the same compression ratio, which is much more beneficial for verifying errors detected in memory tests.

When the selector selects the first data path 401a-401p and the third data path 303a-303d, the 64-bit data word output by all of the memory array banks 320a-320d are compressed by the compress module 440 into the 16-bit data word IO[0:15] on the bus 350 and then the 16-bit data word IO[0:15] are further compressed by the compression module 360 into the 4-bit data word received by the data buffer 370. The compression ratio is 16:1. In this case, each bit of the data word output by each of the memory array banks 320a-320d is compressed into a corresponding bit of the data word IO[0:15] on the bus 350 and all of the bits of the data word IO[0:15] are compressed into the 4-bit data word output by the compression module 360.

The written data regarding the particular memory array bank is generated according to the 4-bit data word output by the compression module 360. Since the 4-bit data word has 16 possible values, the generated written data also has 16 possible values. When the compression ratio is 16:1, the generated written data regarding any one of the memory array banks in FIG. 2 has only 2 possible values, while the generated written data regarding any one of the memory array banks in FIG. 4 has 16 possible values. The memory device in FIG. 4 provides more possible values under the same compression ratio, which is more beneficial for verifying errors detected in memory tests.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A memory device, comprising:
   a plurality of memory array banks;
   a bus;
   a data buffer for providing data from the memory array banks to an external node;
   a first data path comprising a first compression module for compressing the data from the memory array banks to the bus;
   a second data path for transmitting the data from the memory array banks to the bus;
   a third data path comprising a second compression module for compressing data from the bus to the data buffer; and
   a fourth data path for transmitting the data from the bus to the data buffer.

2. The memory device of claim 1, wherein, for every two adjacent bits output by the first compression module, the first one of the two adjacent bits is a result of compressing a plurality of data bits from one of the memory array banks and the second one of the two adjacent bits is a result of compressing a plurality of data bits from another one of the memory array banks.

3. The memory device of claim 2, wherein the one of the memory array banks and the another one of the memory array banks are adjacent to each other.

4. The memory device of claim 1, wherein each bit output by the first compression module is a result of compressing a data bit from each of the memory array banks.

5. The memory device of claim 4, wherein the i-th bit output by the first compression module is a result of compressing the i-th data bit from each of the memory array banks and i is a non-negative integer.

6. The memory device of claim 1, further comprising:
a selector for selecting one of the first and the second data paths and one of the third and the fourth data paths to couple the data from the memory array banks through the bus to the data buffer.

7. A memory device, comprising:
a plurality of memory array banks;
a data buffer for providing data from the memory array banks to an external node; and
a plurality of data paths for coupling the data from the memory array banks to the data buffer, wherein
the first data path of the plurality of data paths comprises a first compression module for compressing the data from the memory array banks;
for every two adjacent bits output by the first compression module, the first one of the two adjacent bits is a result of compressing a plurality of data bits from one of the memory array banks and the second one of the two adjacent bits is a result of compressing a plurality of data bits from another one of the memory array banks.

8. The memory device of claim 7, wherein the one of the memory array banks and the another one of the memory array banks are adjacent to each other.

9. The memory device of claim 7, further comprising a bus, wherein the first compression module compresses the data from the memory array banks to the bus and the plurality of the data paths further comprises:
a second data path for transmitting the data from the memory array banks to the bus;
a third data path comprising a second compression module for compressing data from the bus to the data buffer; and
a fourth data path for transmitting the data from the bus to the data buffer.

10. The memory device of claim 7, further comprising:
a selector for selecting one of the first and the second data paths and one of the third and the fourth data paths to couple the data from the memory array banks through the bus to the data buffer.

11. A memory device, comprising:
a plurality of memory array banks;
a data buffer for providing data from the memory array banks to an external node; and
a plurality of data paths for coupling the data from the memory array banks to the data buffer, wherein
the first data path of the plurality of data paths comprises a first compression module for compressing the data from the memory array banks;
each bit output by the first compression module is a result of compressing a data bit from each of the memory array banks.

12. The memory device of claim 11, wherein the i-th bit output by the first compression module is a result of compressing the i-th data bit from each of the memory array banks and i is a non-negative integer.

13. The memory device of claim 11, further comprising a bus, wherein the first compression module compresses the data from the memory array banks to the bus and the plurality of the data paths further comprises:
a second data path for transmitting the data from the memory array banks to the bus;
a third data path comprising a second compression module for compressing data from the bus to the data buffer; and
a fourth data path for transmitting the data from the bus to the data buffer.

14. The memory device of claim 11, further comprising:
a selector for selecting one of the first and the second data paths and one of the third and the fourth data paths to couple the data from the memory array banks through the bus to the data buffer.

* * * * *